, 
United States Patent [19]

Moriyama

[11] Patent Number: 4,627,058
[45] Date of Patent: Dec. 2, 1986

[54] CODE ERROR CORRECTION METHOD

[75] Inventor: Yoshiaki Moriyama, Tokorozawa, Japan

[73] Assignee: Pioneer Electronic Corporation, Tokyo, Japan

[21] Appl. No.: 695,067

[22] Filed: Jan. 25, 1985

[30] Foreign Application Priority Data

Jan. 27, 1984 [JP] Japan .................. 59-014039
Jan. 27, 1984 [JP] Japan .................. 59-014040

[51] Int. Cl.$^4$ .................................. G06F 11/10
[52] U.S. Cl. ............................. 371/37; 371/40
[58] Field of Search ............... 371/37, 38, 39, 40, 371/48, 49, 50, 51

[56] References Cited

U.S. PATENT DOCUMENTS

| | | | |
|---|---|---|---|
| 3,200,374 | 8/1965 | Ballard | 371/50 |
| 4,447,902 | 5/1984 | Wilkinson | 371/37 |
| 4,497,058 | 1/1985 | Sako | 371/39 |
| 4,541,092 | 9/1985 | Sako | 371/37 X |
| 4,564,945 | 1/1986 | Glover | 371/40 X |

Primary Examiner—Jerry Smith
Assistant Examiner—Robert W. Beausoliel, Jr.
Attorney, Agent, or Firm—Schwartz, Jeffery, Schwaab, Mack, Blumenthal & Evans

[57] ABSTRACT

An improved method of code error correction is disclosed, for detection and correction of errors in data words or check words of a block of data after transmission-reception or recording-reproduction of the data. The method is of the type in which the data block is divided into three sets of sub-blocks, divided along three different array directions, with check words being assigned to each sub-block before transmission or recording based on specific computations (e.g. in accordance with Reed-Solomon code), and is characterized in that a stage of error detection processing applied to one specific set of sub-blocks invariably succeeds each stage of error correction processing applied to the other two sets of sub-blocks and in that three possible states of each error flag can result from correction processing, to respectively indicate a high probability, a low probability, or an intermediate degree of probability of errors being present in the corresponding word.

6 Claims, 11 Drawing Figures

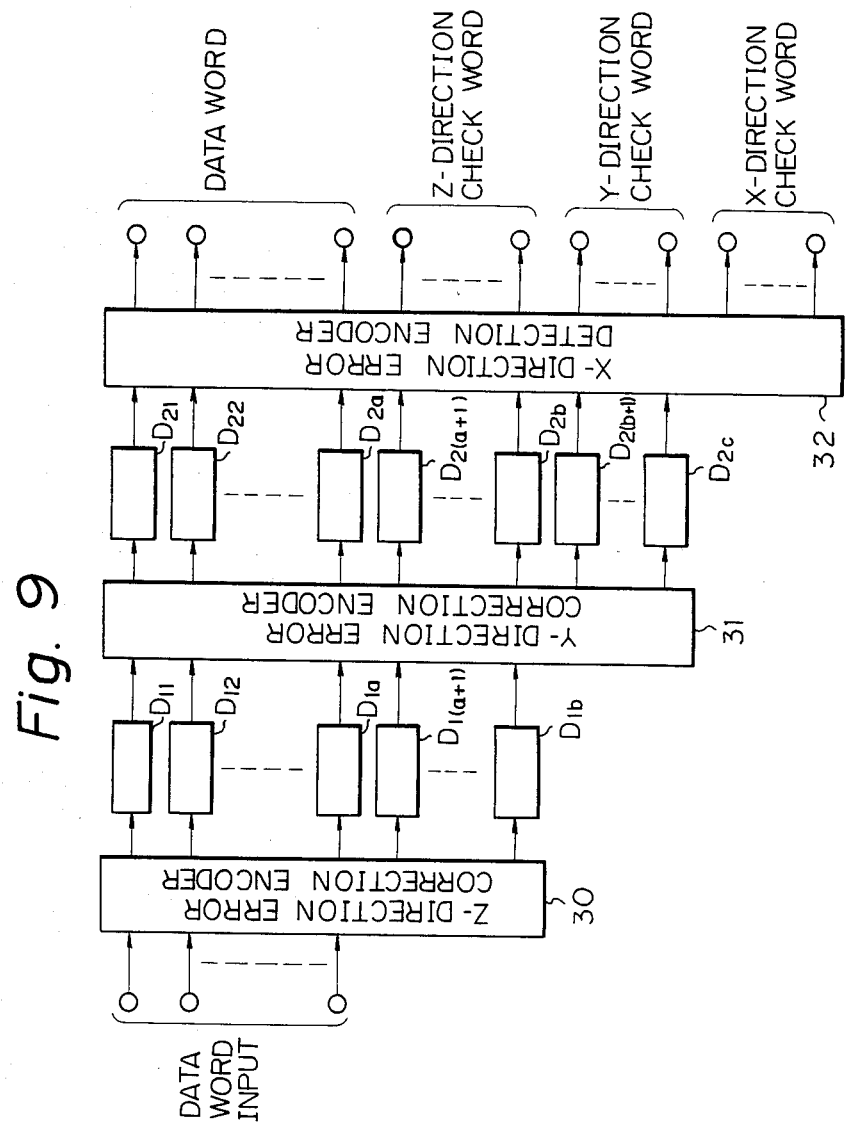

CODE ERROR CORRECTION METHOD

BACKGROUND OF THE INVENTION

The present invention relates to an improved method of code error correction, for detecting and correcting errors in data after the data has been reproduced (following recording thereof) or received (following transmission thereof). Various methods of data error detection and correction are known, however the present invention is specifically applicable to a method whereby the data is divided into blocks of data words prior to transmission or recording, and each data block is divided into three sets of sub-blocks for the purpose of assigning a pair of check words to each sub-block. Each set of sub-blocks comprises the entire data block, with the sets being respectively formed by dividing the data block along three different array directions. The contents of the check words assigned to each sub-block are determined in accordance with a computation applied to the contents of all of the data words of the sub-block, such that if no error is present within the sub-block, the sum of the contents of the data words and check words of that sub-block must equal a predetermined value (e.g. zero). Upon reception (or reproduction) of the data block, the computation described above can be performed upon each set of sub-blocks to detect the presence or absence of errors therein, and also in the case of certain error patterns, to enable correction of the errors. That is to say, if the number of errors within the sub-block is below a certain number, the system determines the positions of data words or check words containing errors and the bit positions of the errors within these words, so that correction can be performed. During this error correction processing, an error flag (i.e. a binary code bit) is assigned to each data word and check word), and the error flags of each sub-block are set to states indicating the presence or absence or errors therein, respectively, in accordance with the results of error detection processing and of any error correction processing performed on the sub-block.

The data block is transmitted (or recorded) in a sequence corresponding to the sequence of sub-blocks constituting one of the sets referred to above. As a result, since errors produced during recording-reproduction or transmission-reception tend to occur in bursts, each sub-block of the latter set will have a high probability of containing isolated bursts of successive errors therein, while the other two sets of sub-blocks will contain errors which are much more dispersed, so that the probabiity of each sub-block containing a burst of errors is very low. Thus, since correction of a set of sub-blocks containing a large number of errors is not possible, it is usual to perform only error detection for the set of sub-blocks corresponding to the transmission (or recording) sequence, and to simply set the error flags of all of the words within a sub-block in which an error is found to the "error indicating" status. Thereafter, both error detection and error correction processing is performed on the other two sets of sub-blocks, utilizing the information conveyed by the states of the error flags set in the initial error detection processing of the first set. No further error detection processing of the first set of sub-blocks (i.e. that corresponding to the data transmission or recording sequence) is performed, and as a result, as will be described in detail hereinafter, any missing of errors by the processing applied to the remaining two sets of sub-blocks, or any erroneous correction which results from this processing, can result in data errors being produced (or missed) which are impossible to correct thereafter, even if error correction processing is successively applied to the latter two sets of sub-blocks through a plurality of repetitions.

SUMMARY OF THE INVENTION

It is an objective of the present invention to overcome the disadvantages of prior art methods of data error detection and correction, by providing a method whereby the possibility of uncorrectable errors arising due to imperfect operation of the correction processing is made extremely low, so that a very high degree of error detection and correction reliability is achieved. This is accomplished by arranging that a stage of error detection processing of the first set of sub-blocks referred to hereinabove (i.e. that which corresponds to the sequence in which the words of the data block have been successively transmitted or recorded) is performed following each stage of error correction processing applied to the other two sets of sub-blocks. In addition, each error flag, with the method of the present invention, is constituted by for example, two binary code bits, so that three different states of an error flag can be established. These are, respectively, an "error indication" indication condition (referred to in the following simply as the "ON" state), a "no error present" indication condition (referred to in the following as the "OFF" state), and an intermediate condition which indicates neither the presence nor the absence of errors (referred to in the following as the "I" state. The results of error correction processing performed upon a sub-block are correspondingly classified into three possible types, namely, (1) a result which indicates that there is a very high probability that no further error remain within that sub-block, in which case the error flags of all of the words of that sub-block are set to the "OFF" state, (2) a result which indicates that there is a very high probability of errors remaining in that sub-block, in which case the error flags of all of the words of that sub-block are reset to the "ON" state, and (3) a result which indicates that there is a certain possibility that errors remain within the sub-block, with the probability not clearly established. In this case, the error flags of all of the words in the sub-block are set to the "I" state. When such error correction processing upon one set of sub-blocks is completed, then as stated above this is followed by a stage of error detection processing applied to the first set of sub-blocks (designated hereinafter as the X-direction set). Following this error detection processing, the error flag of each word which was previously set to the "ON" state or to the "OFF" state by the results of the preceding correction processing is left unchanged, while the error flag of each word which had been set to the "I" state will be altered (i.e. set to the "ON" or "OFF" state) in accordance with the results of the detection processing. Such treatment of the error flags ensures that any errors which have been produced by incorrect correction processing will be detected during a subsequent detection processing stage, and will thereafter be corrected during a subsequent correction processing stage. In this way, the problem of the prior art described hereinabove, i.e. the possibility of uncorrectable errors arising from the error correction processing itself, is substantially eliminated, even if there is a very high incidence of errors.

BRIEF DESCRIPTION OF THE DRAWINGS

FIG. 9 is a general block diagram of an encoding apparatus for computing and assigning check words to the sub-blocks of the example of FIG. 7.

DESCRIPTION OF THE PREFERRED EMBODMENTS

Figure 1:
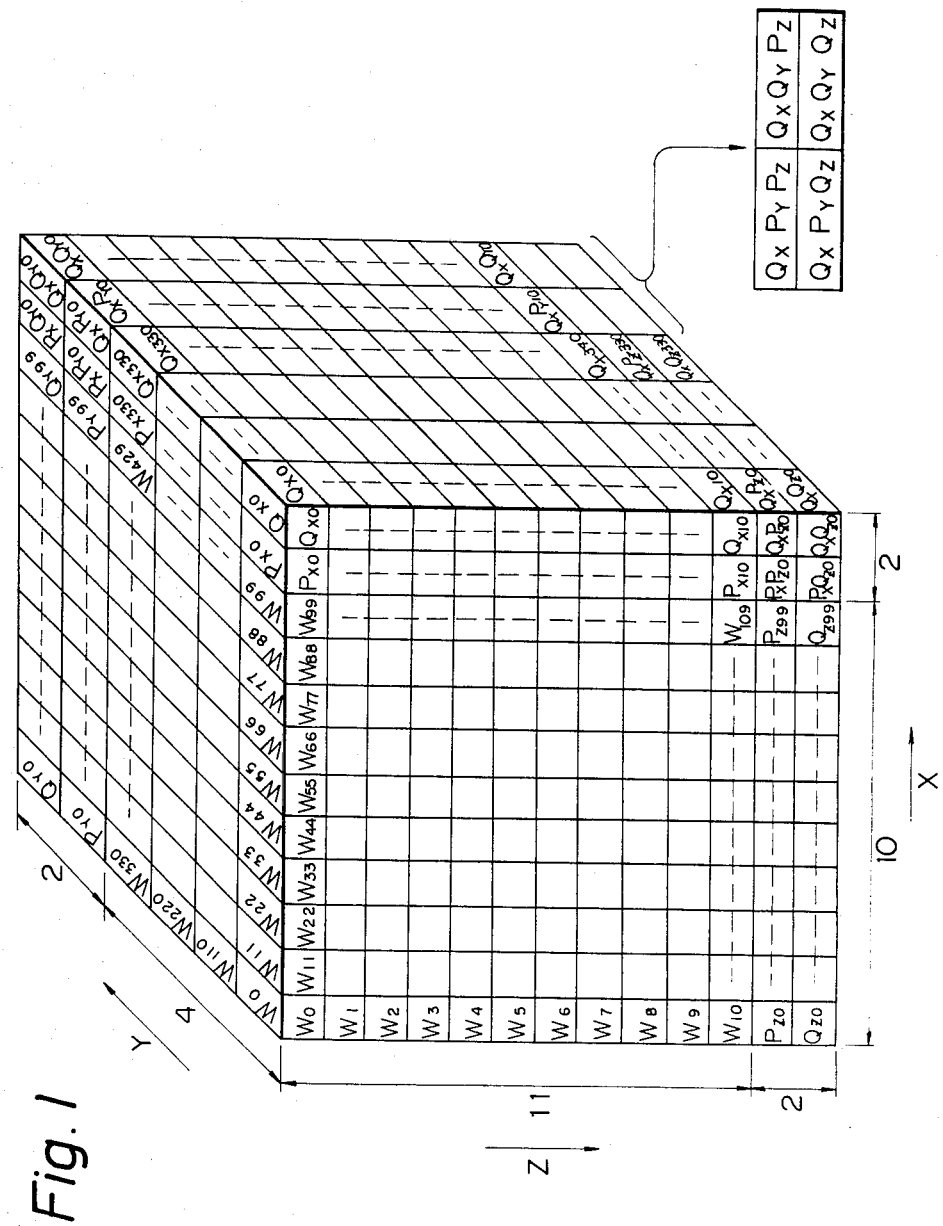
FIG. 1 is a pictorial illustration of the arrangement of a data block into three sets of sub-blocks containing data words and check words, formed by dividing the data block along three different array directions.

A prior art method of data error detection and correction will first be described, referring to FIG. 1 which shows a block of data represented as a three-dimensional array of words. In this example, the data block is shown composed of three sets of sub-blocks which are respectively formed by dividing the entire data block into a plurality of sub-blocks along three different array directions (i.e. the X, Y and Z directions). A pair of check words encoded in accordance with the Reed-Solomon code are assigned to each sub-block. In this example, each sub-block of the set arrayed along the X direction is composed of 10 data words and the two check words, each sub-block of the set arrayed along the Y direction is composed of 4 data words and two check words, and each sub-block of the set arrayed along the Z direction is composed of 11 data words and two check words, i.e. the data block comprises 440 data words designated as $W_0$ to $W_{439}$ respectively, plus the check words. The "X", "Y" or "Z" portion of the subscript of each P or Q check word indicates the set of sub-blocks to which the check word belongs, i.e. the direction of extension of the sub-blocks of that set, as shown in FIG. 1. The numeric portion of the subscript of each P or Q check word specifies the subscript number of the data word which is at the head of the corresponding sub-block. Each set of sub-blocks (i.e. the X, Y or Z set) thus includes a sub-set of sub-blocks which comprise only check words, i.e. the first such check word sub-blocks of the X-direction set of sub-blocks is shown in FIG. 1 as $P_{z0} \ldots Q_x P_{z0}$, and $Q_{z0} \ldots Q_z Q_{z0}$.

Here, the subscripts of the check word $Q_x P_{z0}$ for example indicate that the leading word of the corresponding sub-block along the X direction is $P_{z0}$ while at the same time the leading word of the corresponding sub-block along the Z direction is $Q_{x0}$ (i.e. the numeric portion of the subscript of each leading word is 0). In the case of the word $Q_x Q_y Q_x$, this is a Q check word for sub-blocks aligned along the X, Y and Z directions, with the numeric portion of the subscript of the leading word of each of the latter sub-blocks being 0, i.e. this is simultaneously the check word $Q_x$ along the X direction, the check word $Q_y$ along the Y direction, and the check word $Q_z$ along the Z direction. That is to say, the Reed-Solomon code is of linear type.

In the following, it will be assumed that each data word and check word has 8 bits, and that the Galois field of the Reed-Solomon code is $2^8$. It will further be assumed that after the data block has been formed as illustrated in FIG. 1, it is then transmitted (or recorded) in the order X-Y-Z, i.e. the X-direction sub-blocks of the "uppermost layer" of the array shown in FIG. 1 would first be transmitted (or received) sequentially, starting with the sub-block beginning with data word $W_0$, then the X-direction sub-blocks of the "second layer" starting with the sub-block beginning with data word $W_1$, and so on. That is to say, the order in which the words are transmitted (or received) will be: $W_0$, $W_{11}, \ldots W_{99}$, $P_{x0}$, $Q_{x0}$, $W_{110}, \ldots W_{220}, \ldots W_{330}, \ldots$ $W_{429}$, $P_{x330}$, $Q_{x330}$, $Q_{x330}, \ldots P_{y0}, \ldots P_{y99}$, $P_x P_{y0}$, $Q_x Q_{y0}$, $\ldots Q_{y99}$, $P_x Q_{y0}$, $Q_x Q_{y0}$, $W_1, \ldots W_2, \ldots W_3, \ldots W_4, \ldots W_5, \ldots W_6, \ldots W_7, \ldots W_8, \ldots W_9, \ldots W_{10}, \ldots W_{109}$, $P_{x10}$, $Q_{x10}$, $Q_{x340}, \ldots Q_x P_{z330}, \ldots Q_x Q_y 10$, $P_{z0}, \ldots P_{z99}$, $P_x P_{x0}$, $Q_z P_{z0}, \ldots Q_x P_{z330}$, $Q_x P_y P_z, \ldots Q_x Q_y P_z, \ldots Q_{z0}$, $\ldots Q_{z99}$, $P_z Q_{z0}$, $Q_z Q_{z0}, \ldots Q_z Q_{z330}, \ldots Q_x P_y Q_z, \ldots$ $Q_x Q_y Q_z$.

When the data block is subsequently received or reproduced, it is again assembled into the form shown in FIG. 1, and error detection and correction processing performed thereon as described in the following. The check words are then discarded, and the data words are read out in the order Z-X-Y starting from words $W_0$, $W_1, \ldots$ i.e. in the original data sequence in accordance with the numeric subscripts of words $W_0$ to $W_{439}$, to thereby restore the data to its original form.

Since errors generated during data transmission or recording generally occur inbursts, it can be understood that since the data words are transmitted (or received) in the order X-Y-Z as described hereinabove, (i.e. with the data words and check words in one sub-block of the X-direction set being transmitted sequentially, then the data words and check words of the next sub-block of that set, and so on), there will be a high probability that such bursts of errors will result in groups of errors appearing in successively adjacent words in isolated sub-blocks of the X-direction set of sub-blocks, when the data words and check words are arranged in the form shown in FIG. 1 after being received or reproduced. On the other hand, the manner in which the Y-direction and Z-direction sets of sub-blocks are transmitted (or received) will be such that error bursts occurring during the transmission or recording process will be effectively dispersed throughout each of these sets of sub-blocks. Thus, although the total number of errors occurring in the Y-direction and Z-direction sets of sub-blocks after reception or reproduction of the data will of course be identical to that of the X-direction set, the probability of a plurality of errors occurring in each sub-block of the Y and X-direction sets will be very much lower than for the X-direction set.

The check words $P_u$ and $Q_u$ assigned to a sub-block (where u denotes the subscript of the check word, determined as described hereinabove, indicating whether the sub-block is within the X, Y or Z-direction set) in accordance with the Reed-Solomon code, must meet the following requirements:

$$\sum_{k=1}^{v} W_k + P_U + Q_U = 0 \quad (1)$$

$$\sum_{k=1}^{v} a^{v+2-k} W_k + aP_U + Q_U = 0 \quad (2)$$

In the above, $\alpha$ is the Galois field (GF), which (assuming an 8-bit word length as stated above) has the value $2^8$. It is assumed that the addition is performed by binary arithmetic. V denotes the number of data words in the sub-block (i.e. taking the values 10, 4 and 11 respectively for the X, Y and Z sets in the example of FIG. 1). $W_k$ denotes a data word within the sub-block, with the subscript K denoting the position of the word within the sub-block, and taking the value 1 for the leading position.

The following equation can be derived from equations (1) and (2):

$$P_U = \frac{\sum_{k=1}^{v} (1 + a^{v+2-k}) W_k}{1 + a} \quad (3)$$

$$Q_U = \frac{\sum_{k=1}^{v} (a + a^{k+2-v}) W_k}{1 + a} \quad (4)$$

In order to perform error detection and correction of the data block, quantities referred to as syndromes $S_{PU}$ and $S_{QU}$ are first derived, by performing computations using $P_u$ and $Q_u$, in accordance with the following equations:

$$S_{PU} = \sum_{k=1}^{v} W_k + P_U + Q_U \quad (5)$$

$$S_{QU} = \sum_{k=1}^{v} a^{v+2-k} W_k + aP_U + Q_U \quad (6)$$

If errors have occurred in two words of the sub-block being checked, and if it is known that the positions of these words within the sub-block are represented by K=i and K=j, then designating the error patterns in these words (i.e. the bit positions within each word at which the error appears) as $e_i$ and $e_j$ respectively, the following relationships are true:

$$S_{PU} = e_i + e_j \quad (7)$$

$$S_{QU} = a^{v+2-i} e_i + a^{v+2-j} e_j \quad (8)$$

The following equations can be derived from equations (7) and (8):

$$e_i = \frac{a^{v+2-j} S_{PU} + S_{QU}}{a^{v+2-i} + a^{v+2-j}} \quad (9)$$

$$e_j = \frac{a^{v+2-i} S_{PU} + S_{QU}}{a^{v+2-i} + a^{v+2-j}} \quad (10)$$

Thus, if the positions (i and j) of two words containing errors within the sub-block are known, then the quantities $e_i$ and $e_j$ can be derived and utilized to perform correction of the errors.

If on the other hand only one word in the sub-block contains an error, then denoting the word position in the sub-block as K=i, the corresponding error pattern quantity $e_i$ and the syndromes $S_{PU}, S_{QU}$ are given by the following equations:

$$S_{PU} = e_i \quad (11)$$

$$S_{QU} = a^{v+2-i} e_i \quad (12)$$

The following equation can then be derived from equations (11) and (12):

$$a^i = a^{v+2} \frac{S_{PU}}{S_{QU}} \quad (13)$$

Thus, if there is only a single word (data word or check word) containing an error within the sub-block being checked, then even if the position of that error word is not known, that position (i) can be obtained from the quantity $a^i$ given by equation (13). In addition, the error pattern quantity $e_i$ is given directly by $S_{PU}$ in equation (11), so that the error can be corrected. As stated hereinabove, if two words (data words or check words) containing errors exist within the sub-block being checked, then it is only possible to perform correction of these words if their positions within the sub-block are known.

Figure 2:
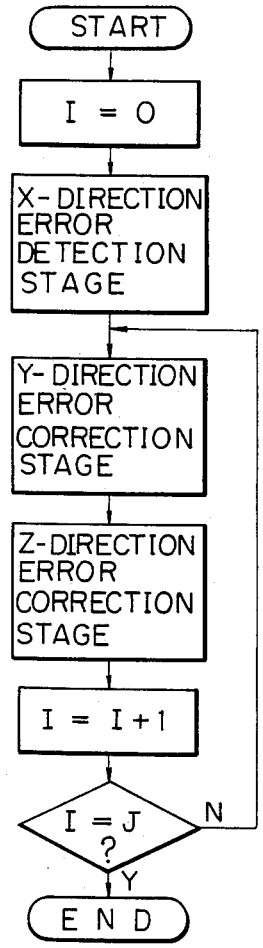
FIG. 2 is a flow chart to illustrate a prior art method of data error detection and correction applied to the data block example of FIG. 1.

As noted previously, there is a considerably higher probability of bursts of errors occurring in the X-direction set of sub-blocks than for the Y and Z-direction sets. Thus, with the prior art method of error correction based on the computations described above, error detection is first performed for the X-direction set of sub-blocks without any error correction processing being attempted, since there is a high probability that many sub-blocks will contain too many errors to permit correction to be performed. If an error is found in any of the X-direction set of sub-blocks during this error detection processing (i.e. if the syndromes $S_{PU}$ and $S_{QU}$ obtained by performing the computations of equations (5) and (6) on the data words and check words of that sub-block are not both equal to zero) then all of the error flags of that sub-block are set to an error indication state. This state will be assumed to be logic "1", while the opposite state of the error flag will be assumed to be logic "0". When this error detection processing of the X-direction set of sub-blocks is completed, similar error correction processing is performed on the Y-direction set of sub-blocks, i.e. by computing the syndromes $S_{PU}$ $S_{QU}$ for each sub-block. However in this case, it is assumed that in general the number of errors occurring in a sub-block will be sufficiently low to permit error correction, and such correction is therefore performed, by computing the quantities $e_i$, $e_j$ and described above. During this correction processing, certain assumptions are made concerning the positions of errors in a sub-block, as described hereinafter, which may or may not be correct. This error correction processing is then repeated for the Z-direction sub-block set. When this is done, the reduction of the overall number of errors due to correction performed in the previous Y-direction processing will have increased the number of Z-direction sub-blocks which contain correctable errors (i.e. less than three words containing errors, with corresponding error flags set). With this prior art method, error correction processing is generally terminated at this stage, however it is also possible to repeat the error correction processing stages applied to the Y and Z-direction sub-block sets, one or more times, in order to further increase the error correction capability. This prior art method of error detection and correction is illustrated by the flow chart of FIG. 2. Here, J denotes the number of repetitions of successive error correction processing of the Y and Z-direction sub-block sets. This is an integer whose value is one or more.

Figure 3A:
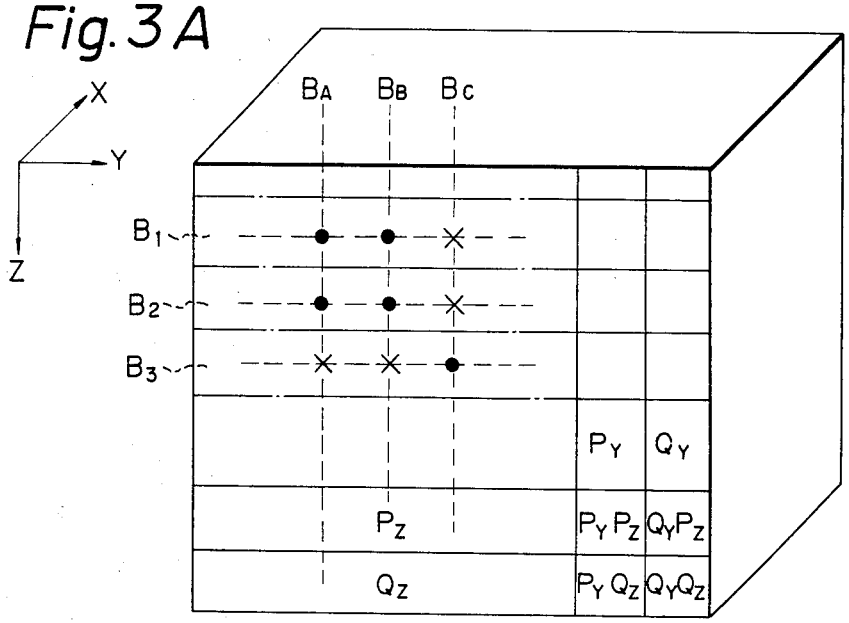
FIGS. 3(A) and 3(B) are diagrams for illustrating respectively correct and erroneous error detection and correction processing by the method illustrated in FIG. 2.

Ideally, these repetitions of the error correction processing should result in correction of errors produced by the incorrect assumptions referred to above. However in fact, with this prior art method, errors may be introduced which become impossible to correct, as will now be described. An example of successful error correction processing performed on the Y-direction set of sub-blocks utilizing the prior art method described above will first be described, referring to FIG. 3(A). Here, the data block shown in FIG. 1 is shown in the condition after completion of the X-direction error detection processing, performed initially as indicated in the flow chart of FIG. 2. In FIG. 3(A), the "." and "x" symbols indicate words for which the corresponding error flag is set to the "1" state. The "." symbol indicates a word within a sub-block of the Y-direction set which is also a member of a sub-block of the X-direction set in which an error has beeen found during the preceding X-direction detection processing, (so that the error flags of all of the data words and check words of that X-direction sub-block have been set to the "1" state) and which moreover actually contains an error. The "x" symbol indicates a word within a sub-block of the Y-direction set which is also a member of a sub-block of the X-direction set in which an error has been found during the preceding X-direction detection processing, but which does not itself contain an error. Thus, although sub-blocks B1 and B2 each have three error flags set to the "1" state, only two of these error flags actually correspond to words containing errors, as indicated by the "." symbols. Similarly, although three error flags of sub-block B3 are set to the "1" state, this sub-block actually only contains one word having an error.

When Y-direction error correction processing is carried out on sub-block B1, the number of words of that sub-block which actually contain errors is not known, but only the fact that if any word does contain an error it will be one of the three words for which the error flag is set to the "1" state. Due to the high degree of dispersion of the errors within the Y and Z-direction set of sub-blocks, as described above, it is probable that there is actually only one error word in sub-block B3. Acting on this assumption, a computation is performed, as described above, to determine the position of this error word. If the position thus found does not correspond to that of any of the three words whose error flag is set to the "1" state, then this is taken as indicating that there are two or more error words (whose positions are not known) so that correction is not possible. All of the error flags in sub-block B1 are set to the "1" state. A similar process is then performed for sub-block B2. In the case of sub-block B3, the word position obtained from the error detection computation will correspond to that of the word (indicated by the "." symbol) which actually contains and error. This correspondence of positions, and the fact that the error flag of that word is at the "1" state, indicate that this word can be corrected, which is then performed, and all of the error flags of sub-block B3 are then reset to the "0" state. Thus subsequently, when the above error correction processing is carried out the Z direction, the condition shown in FIG. 3 will have changed from a set of three Z-direction sub-blocks each containing three error flags set to the "1" level (with two of these sub-blocks containing a pair of error words, as indicated by the "." symbols, so that correction is not possible) to a set of three sub-blocks for which two error flags are in the "1" state. Only two of these sub-blocks will actually contain a pair of error words, and since the positions of these words are known, correction can be carried out by means of the computation process described hereinabove.

Figure 3B:
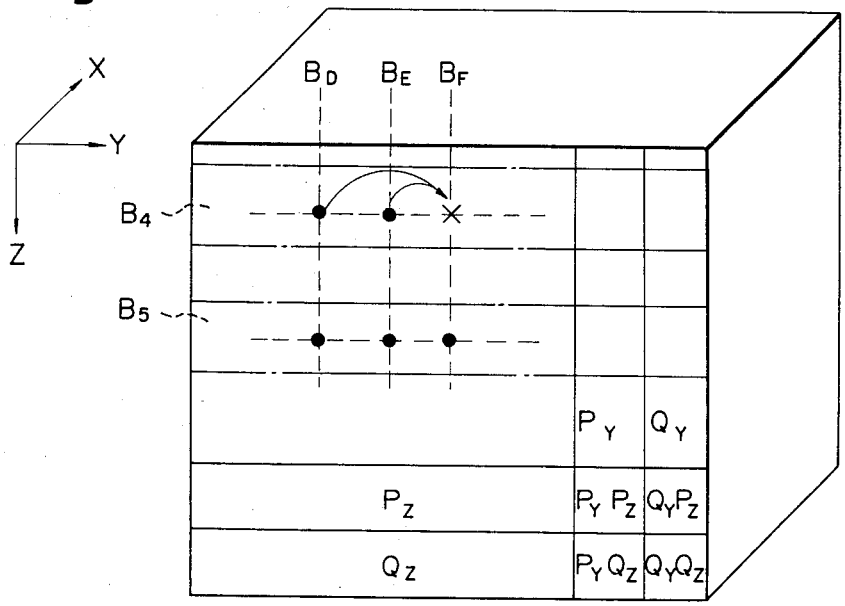

However, uncorrectable errors can be generated by this prior art method, as will now be described referring to FIG. 3(B). Here, the Y-direction set of sub-blocks of FIG. 3(A) is again shown, with a sub-block B4 having three error flags set to the "1" state and containing two actual error words (indicated by the "." symbols) and one word which is actually correct but has the error flag set to the "1" state (indicated by the "x" symbol), with these states of the error flags having been set in accordance with the results of a preceding X-direction error detection processing step as described hereinabove. It will now be assumed that when the error word position determining computation described hereinabove is performed, to find the position of a single error word in the sub-block, the position obtained (based on the erroneous contents of the two words containing errors, as indicated by the arrows) corresponds to that of the word which is actually correct but whose error flag is set to the "1" state. Such an erroneous position detection result can occur, with the prior art method, depending upon the specific error contents of the error words and the relative positions of the error words and of the correct word whose error flag is at the "1" state. With the prior art method, the system will then assume that since the error word position thus found corresponds to a word whose error flag is at the "1" state, this word contains an error. The contents of the word will therefore be modified by performing an (erroneous) correction operation thereon, so that an error is in fact introduced into that word. All of the error flags of sub-block B4 are then reset to the "0" state, to indicate that all of the words in the sub-block are correct. However in actual fact, the sub-block will now contain three words which are in error. And since the error flags have been reset to the "0" state, no correction of these errors will be possible in the succeeding Z-direction error correction processing.

It might be thought that this problem of the prior art method could be avoided by arranging that, when three or more error flags of a sub-block are set at the "1" state prior to error correction processing of that sub-block, the error flags are left unchanged in the "1" state after this processing, to thereby indicate the possibility that errors remain within the corresponding words after the processing. This would enable the error word pattern shown in FIG. 3(B) to be corrected, in the succeeding Z-direction error correction processing. However if this is done then an error word pattern of the form shown in FIG. 3(A) cannot be corrected, since in that case there would be three Z-direction sub-blocks encountered during Z-direction processing which would each contain three error flags set to the "1" level, and which could not therefore be corrected, i.e. an uncorrectable error condition would occur. Therefore, it may be considered to stop error correction in case three or more error flags are all "1" in order to avoid incorrect error correction. However, in this case, it is impossible to correct such error pattern as shown in FIG. 3(A) even though such error pattern as shown in FIG. 3(B) can be corrected.

Thus, with the prior art method, it is not possible to ensure reliable error correction processing, if sub-blocks containing three or more error flags set to the "error indication" state are produced in the Y and Z-direction set of sub-blocks by the initial X-direction state of error detection if some of these sub-blocks contains two or more words which are actually in error. This is basically due to the fact that detection of sub-blocks containing errors is only performed once, along the X-direction, and no further checking of error word positions is performed thereafter. A large number of error words patterns therefore cannot be corrected, by this prior art method.

Figure 4:
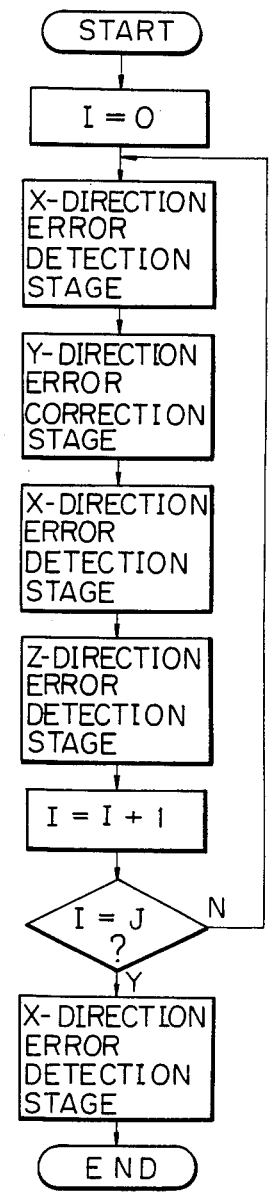
FIG. 4 is a flow chart to illustrate a first embodiment of a data error detection and correction method according to the present invention, applicable to the data block shown in FIG. 1.

Embodiments of the present invention will now be described, whereby the number of error word patterns which can be corrected is maximized. It is a basic feature of the method of the present invention, as applied to the data block example of FIG. 1, that after an initial stage of X-direction error position detection processing (carried out as described for the prior art example above) each stage of error correction processing carried out along the Y or Z directions is subsequently followed at least once by a further stage of X-direction error position detection processing. In this way, the possibility of uncorrectable errors being produced by the correction processing is substantially eliminated, and the number of word error patterns which can be corrected is increased. It is also a feature of the present invention that each error flag attached to a word is made up of for example two binary code bits, so that an error flag can take three different states designated as the "ON", "OFF" and "I" states. FIG. 4 is a flow chart of a first embodiment of the method of the present invention, applicable for example to the data block shown in FIG. 1. Initially, a count value I is set to zero, then an initial stage of X-direction error detection processing is performed as described for the prior art method above, i.e. with all of the error flags of a sub-block containing any error being set to the "ON" state. Error correction processing is then performed for the Y-direction set of sub-blocks, preferably in accordance with a specific processing sequence as described hereinafter. A second stage of X-direction error detection processing is then performed, which is followed by error correction processing for sub-blocks along the Z-direction. The count value "I" is then incremented by one, and the four processing stages described above, for the X, Y, X and Z direction successively, are then repeated at least once. When the number of repetitions has reached a predetermined integer value J (whose value is greater than one) then processing is terminated. It can thus be understood that since there are two or more repetitions of the X,Y, X, Z-direction processing sequence, each Y-direction and Z-direction stage of error correction processing is succeeded by a stage of X-direction error detection processing.

It will of course be necessary to initially set all of the error flags to the "I" state, before the initial X-direction error detection processing stage is entered (i.e. in the embodiment of FIG. 4, before the processing loop is entered). This error flag initializing processing is not indicated in the drawings.

With the embodiment of FIG. 4, after processing has been started, a loop is entered as shown, in which the initial processing stage comprises X-direction error detection. In this stage, when the loop has been first entered, an error detection check is made of each X-direction sub-blocks, by the computations described hereinabove. If any error is detected in a sub-block, then all of the error flags are set to the "ON" state (i.e. from the initializede "I" state), while if no error is detected in the sub-block, all of its error flags are set to the "OFF" state.

Figure 5:
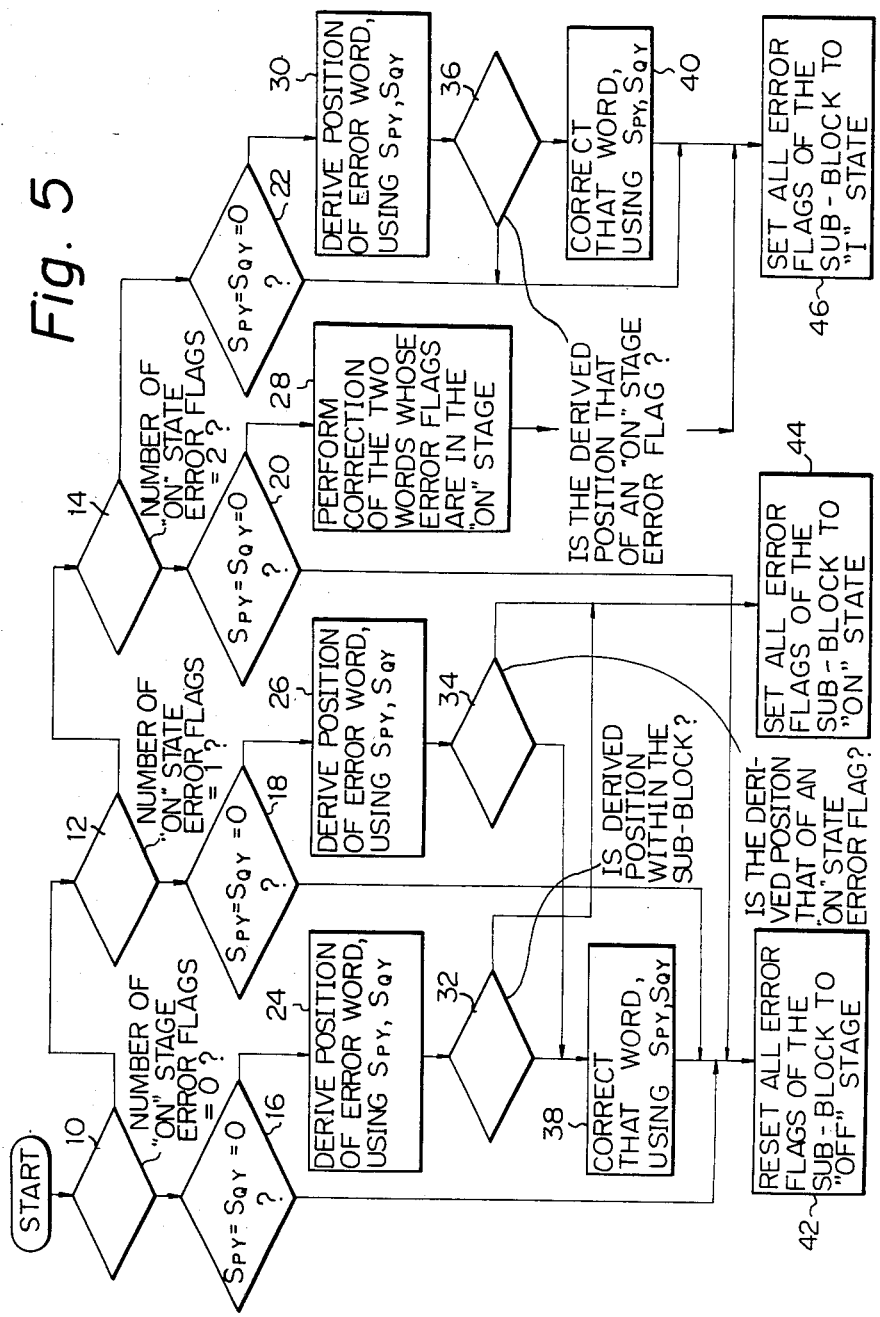
FIG. 5 is a flow chart to illustrate the manner in which error detection and correction processing is applied to each of the Y and Z sets of sub-blocks shown in FIG. 1, with the method of the present invention.

The Y-direction error correction stage is then entered. With the method of the present invention, a stage of error correction processing in the Y and Z directions, if it is immediately succeeded by an X-direction error detection stage, is preferably carried out in accordance with the sequence shown in the flow chart of FIG. 5. Here, this correction processing is shown for the case of a Y-direction sub-block (using syndromes $S_{PY}$, $S_{QY}$), however an identical sequence (using syndromes $S_{PZ}$, $S_{QZ}$) would be used for Z-direction correction processing with the embodiment of FIG. 4. The sequence of operations shown in the flow chart, as applied to each sub-block, are as follows. Firstly, the number of error flags of the sub-block which have been set to the error-indicating (i.e. "ON") state, by the results of the immediately preceding X-direction error detection stage is examined. In the example of FIG. 5 this is carried out by first determining if the number of error flags thus set is zero, and if not so, whether the number is one, if not so, then whether the number is two, and if not so, then whether the number is three or more (at the nodes indicated by numerals 10, 12 and 14 respectively). An error detection computation is then performed (i.e. to derive the syndromes $S_{PY}$, $S_{qy}$ for that sub-block based upon the contents of the data words and check words constituting the sub-block as described hereinabove) to detect the presence of any errors in the data words and check words of the sub-block (at nodes 16, 18, 20 and 22). If no error is found in the sub-block, and if the number of error flags set to the "ON" state initially was less than three, then all of the error flags of that sub-block are reset to the "OFF" state, to indicate that all of the words in the sub-block are correct (step 42). If on the other hand the number of error flags initially found to be at the "ON" state was greater than two but no errors are detected from $S_{PY}$, $S_{QY}$, then the error flags are all set to the "I" state (performed by step 46, in the event of a "Y" result from node 22).

If an error is found in the sub-block (i.e. if the computed values of Sp and Sq are not both equal to zero) although the number of error flags found to be initially set to the "ON" state was zero (i.e. a "N" output from node 6) then a computation is performed as described hereinabove, based upon the contents of the data words and check words of the sub-block, to determine the position within the sub-block of any word therein which contains an error. If the position thus computed corresponds to the position of any word within the sub-block, then the contents of the word are corrected, by the error correction computation described hereinabove (step 38), and all of the error flags of the sub-block are then reset to the "OFF" state. If on the other hand the position thus computed does not correspond to any word position in the sub-block then all of the error flags of the sub-block are set to the "ON" state (in step 44, in response to a "N" output from node 32), to thereby indicate that the sub-block contains uncorrected errors.

If the number of error flags found initially set to the "ON" state in step (1) above is equal to one, and if an error is found (i.e. an "N" output from node 18), then it is assumed that only one word contains an error, and a computation is performed as described above to determine the position within the sub-block of that word (step 26). If the position thus found corresponds to the position of the word whose error flag is in the "ON" state, then it is clear that this must be the word which is in error, and this is then corrected by an error correction computation. The error flags of the sub-block are then all reset to the "OFF" state (step 42), to indicate that there are no further errors therein. If on the other hand the position does not correspond to any word position in the sub-block then all of the error flags of the sub-block are set to the "ON" state, to indicate the presence of uncorrected errors therein (step 44, in response to a "N" output from node 34).

If the number of error flags found initially set to the "ON" state is equal to two (indicated by a "Y" output from node 14), and an error is detected within the sub-block (i.e. a "N" output from node 20), then it is provisionally assumed that both of the words corresponding to these "ON" state error flags contain errors. An error correction computation is therefore performed, to correct the contents of these two words. This is possible since, as described hereinabove, it is possible to correct errors in two words of a sub-block, if the positions of these words within the sub-block are known. However since it is possible that the error correction produced an erroneous result (e.g. due to there being an error in only one of the two words whose error flag is set to the "ON" state), the states of the error flags of all words in the sub-block are set to the "I" state (i.e. the sequence proceeds to step 46), to indicate that errors may exist in the two words thus corrected. If such errors remain, they will be detected and corrected by subsequent error correction processing.

If the number of error flags found initially set to the "ON" state is greater than two, but no error is detected from the syndromes $S_{PU}$ and $S_{QU}$ as described hereinabove, this does not prove that there are no errors within the sub-block. This is because if there are three or more words containing errors within the sub-block then it is possible that, by coincidence, the computed values of both of the syndromes may be zero. For that reason, in this case (i.e. a "Y" output from node 22), the error flags of the sub-block are all set to the "I" state, thereby indicating that three or more errors may be present in the sub-block. If there are three or more error flags set to the "ON" state and an error is found within the sub-block (i.e. a "N" output from node 22), then it is provisionally assumed that only one of these error flags corresponds to a word which is in error. Computation is then performed to to determine the position within the sub-block of such a word (step 30). If the position thus found does not correspond to any of the error flags which is in the "ON" state, then this indicates that two or more words in the sub-block contain errors, which therefore cannot be corrected at this stage. In this case, all error flags of the sub-block are set to the "I" state (step 46). If the computed position does correspond to that of any of the error flags set to the "ON" state (i.e. a "Y" output from node 36), then it is provisionally assumed that this word (and only this word) is in error, and the contents of the word are then modified by an error correction computation. However, as described hereinabove with reference to sub-block B3 shown in FIG. 3(B), the latter assumption may in fact be erroneous and the correction processing may actually produce an error even in a word which was previously correct but whose error flag was at the "ON" state. For this reason, the error flags are set to the "I" state (step 46), to thereby indicate that one or more of the corresponding words may contain errors.

In the example of FIG. 5, it is assumed that error correction processing is performed along the Y-direction, and hence the syndromes are denoted as $S_{PY}$ and $S_{QY}$. For the embodiment of the present invention shown in FIG. 4, error detection processing for the set of sub-blocks along the X-direction would then be performed. When this is done, the states of those error flags which were set to the "ON" or "OFF" states by the preceding Y-direction correction processing will be left unchanged, while those error flags which had been set to the "I" state by the preceding Y-direction correction processing will be set to the "ON" or "OFF" state in accordance with the results of the X-direction detection processing. More specifically, when errors are detected in an X-direction sub-block during error detection processing, then any error flags of that sub-block which were in the "I" state will be set to the "ON" state, while all other error flags in the sub-block will be left unchanged. Conversely, if no errors are detected in a sub-block by X-direction detection processing, then any error flags of that sub-block which were in the "I" state will be set to the "OFF" state, while all other error flags will be left unchanged.

The latter X-direction error processing will then be succeeded by a stage of error correction processing along the Z direction. For the embodiment of FIG. 4, this will be carried out in accordance with the processing sequence shown in FIG. 5 (using the $S_{PZ}$, $S_{QZ}$ syndromes). Then, if "I" has not become equal to J, a further repetition of X-direction error detection processing succeeded by further Y and Z-direction error correction processing stages takes place.

From the above it can be understood that with the method of the present invention, the setting or resetting of error flags after each stage of error correction processing (e.g. applied to the Y-direction set of sub-blocks as in the example described above) is performed in accordance with the states of the error flags prior to commencement of that processing together with the results of that processing. This is done in order to ensure that, if there is a very high probability that no errors will remain in a sub-block after such error correction processing, then all of the error flags of that sub-block will be reset to the "error-free", i.e. "OFF" state, while if there is an unknown degree of probability that some errors may remain in the sub-block after the processing, then the error flags are set to the "I" state. If however there is a very high probability that errors remain in the sub-block, then all of the error flags are set to the "error indicating", i.e. "ON" state. Such a Y direction error correction processing stage is then succeeded by a X- direction error detection processing stage, in which the words of the data block are examined as a set of sub-blocks aligned perpendicular to those of the preceding Y-direction set, to thereby again detect the X-direction sub-blocks which actually contain errors (with the number of such sub-blocks being of course smaller than those detected during the previous X-direction error detection processing stage). When an error is detected in a X-direction sub-block at this time, then only the error flags of words in that sub-block which (as detected by the preceding Y-direction correction processing) may contain hitherto unconfirmed errors, are set to the "ON" state.

A stage of Z-direction error correction processing is then performed, in the same way as for the Y-direction stage illustrated in FIG. 5, in which highly effective error correction can be performed due to the low number of errors which will now be present in the sub-blocks. However since some error flags may remain in the "I" state following this stage, a further stage of X-direction error detection processing is then implemented (by performing a further repetition of the loop shown in FIG. 4) to be followed by another Y-direction error correction processing stage.

In the embodiment of FIG. 4, after the loop has been repeated J times, a further X-direction error detection processing stage is implemented before processing is terminated. This is preferable, in order to detect and provide an indication of whether any errors have occurred which are impossible to correct. Processing is then terminated.

Applying the method of the present invention as described above to the word error pattern of FIG. 3(A), the error contained in sub-block B3 would be corrected during the first stage of Y-direction error correction processing, and all of the error flags of that sub-block would be reset to the "OFF" state. Assuming that the error position computed for each of sub-blocks B1 and B2 does not correspond with that of any of the "ON" state error flags in these sub-blocks (i.e. a "N" output from node 36 in FIG. 5, for each sub-block), then all error flags of these sub-blocks will be set to the "I" state. During the next X-direction error detection processing stage, it will be detected that there are four X-direction sub-blocks which contain errors (i.e. corresponding to the four error words indicated by "." symbols in sub-blocks B1 and B2). Since the error flags of these four words were at the "I" state, they will then be set to the "ON" state. During the succeeding Z-direction error correction processing stage, the Z-direction sub-block designated as $B_A$ would be found to have two error flags set to the "ON" state, sub-block $B_B$ would also have two error flags at the "ON" state, while sub-block $B_C$ would have all error flags at the "OFF" state. Thus, the errors in sub-blocks $B_A$ and $B_B$ would be corrected (i.e. as indicated by step 28 in FIG. 5), while changing the two "ON" state error flags of each sub-block to the "I" state, to indicate the possibility of erroneous correction having been performed. However during the next X-direction error detection processing stage (assuming for simplicity of description that there are no other errors in the data block), since the correction performed in the preceding stage was not erroneous, no further errors will be detected and the four "I"-state error flags referred to above will be reset to the "OFF" state.

In the case of the error word pattern shown in FIG. 3(B), it will be again assumed that erroneous correction of B4 takes place as described hereinabove. This corresponds to an erroneous "Y" output from node 36 in the flow chart of FIG. 5. Hence, the error flags of sub-block B4 will be set to the "I" state (step 46 in FIG. 5) after this erroneous correction. The error flags of sub-blocks B5 will also be set to the "I" state. When the succeeding X-direction error detection processing stage is then implemented, the error flags shown in sub-block B4 will all be set to the "ON" state, since all three of these error flags now correspond to actual errors. Thus, when the succeeding Z-direction error correction processing stage is performed, each of the Z-direction sub-blocks indicated as $B_D$, $B_E$, and $B_F$ will have a pair of error flags set to the "ON" state, all of which correspond to actual errors. Thus, accurate correction of these sub-blocks (by step 28 in FIG. 5) is now performed. The error flags of sub-blocks $B_D$, $B_E$ and $B_F$ will all be set to the "I" state after this correction. However, when the next X-direction error detection processing stage is implemented, then (again assuming no other errors within the sub-block), all of these error flags will be reset to the "OFF" state.

It can thus be understood that the method of the present invention enables the problem of erroneous correction arising with the prior art method, when there are two or more error flags set to the "error indication" state within a sub-block, to be substantially eliminated. Even if there are a large number of words containing errors initially present within the sub-block, the invention enables substantially all of these to be corrected, if a sufficient number of loop repetitions J is performed.

Figure 6A:
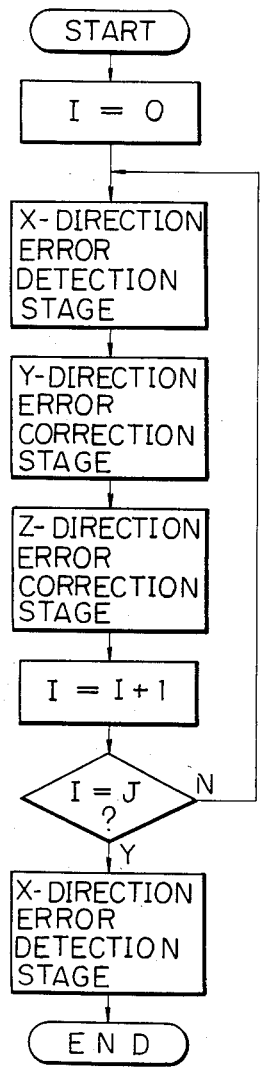
FIGS. 6(A) and 6(B) are flow charts to illustrate two further embodiments of a data error detection and correction method according to the present invention, applicable to the data block shown in FIG. 1.

With the method of the present invention, it is essential that each stage of error correction (of a Y or Z-direction set of sub-blocks) is followed by a stage of X-direction error detection. However it is not essential that each stage of error correction be immediately succeeded by an error detection stage. Instead, it is possible to arrange that two successive stages of error correction processing along two different array direction are succeeded by a stage of error detection processing along the third direction. This point will be illustrated referring to FIGS. 6(A) and 6(B). FIG. 6(A) shows a flow diagram of another embodiment of the method of the present invention which is similar to that of FIG. 4, but differs in that the stage of X-direction error detection processing following each Y-direction error correction processing stage is omitted, i.e. the processing loop comprises a first X-direction error detection processing, a Y-direction error correction processing stage, then a Z-direction error correction processing stage. As in the embodiment of FIG. 4, a final stage of X-direction error detection processing is provided after exit from the latter loop, to detect and indicate any uncorrected errors. With this embodiment, the processing sequence for the Z-direction error correction processing stage can be identical to that shown in FIG. 5 and described hereinabove, since this is (except for the final repetition of the loop) immediately followed by a X-direction processing stage. However since there is no intermediate X-direction error detection processing stage between this Y-direction stage and the succeeding Z-direction error correction processing stage, it is necessary to slightly modify the Y-direction processing sequence. Specifically, step 46 of the flow chart of FIG. 5 must be changed to have the significance "Leave the states of all error flags of the sub-block unchanged from those existing prior to this (Y-direction correction) stage".

Figure 6B:
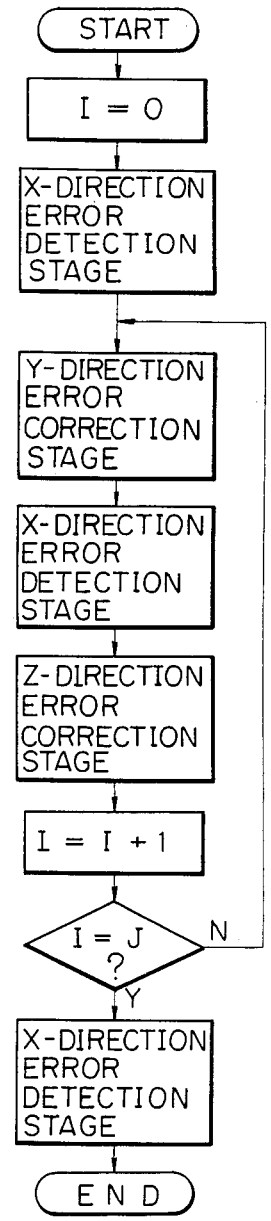

With the embodiment of FIG. 6(B), after an initial X-direction detection processing stage, a loop is entered which comprises a stage of Y-direction correction processing, a stage of X-direction error detection processing, then a stage of Z-direction correction processing. This loop is repeated an integral number of times J, where J is greater than one. In this case, the Y-direction correction stage is always immediately followed by X-direction error detection stage, so that the Y-direction processing sequence can be as shown in FIG. 5. However since the Z-direction correction stage is followed (except for the final repetition of the processing loop) immediately by a Y-direction processing stage, it is necessary to modify the Z-direction processing sequence from that shown in FIG. 5, i.e. such that step 46 has the significance "Leave the states of all error flags of the sub-block unchanged from those existing prior to this (Z-direction correction) stage".

With the embodiments of FIGS. 6(A) and 6(B) described above, the number of error flags which are temporarily set to an erroneous indication (e.g. set to the "ON" state for a word which actually contains no error) will be initially be greater than in the case of the embodiment of FIG. 4. However after a sufficient number of repetitions of the processing loop have been performed, the error correction capability will become identical to that obtainable with the embodiment of FIG. 4.

In the embodiments of the method of the present invention described hereinabove, a stage of X-direction error detection processing is always performed at the start of processing, prior to Y and Z direction error correction processing. However it is equally possible to perform detection processing along two data block directions, at the start of processing, then to perform the first error correction processing stage. For example, X-direction error detection processing can be immediately followed by Z-direction error detection processing, which in turn is followed by Y-direction error correction processing. In this case, the Z-direction detection processing can be performed in a similar manner to that shown in the flow chart of FIG. 5, but with the error correction steps (38 and 40) being omitted. In addition the significance of step 46 in FIG. 5 must be changed to "Leave error flags unchanged at states produced by the immediately preceding (X-direction) error detection processing". In addition, if an error is found in a sub-block which has one or zero error flags at the "ON" state (i.e. a "N" output from nodes 16 and 18 in FIG. 5), then the error flag states of the sub-block must be left unchanged.

In the flow charts of FIGS. 4 and 6, a final stage of X-direction error detection processing is performed before processing is terminated, in order to detect and indicate any uncorrected errors. However this is not an essential feature of the present invention, and may be omitted.

Furthermore in the embodiments described above, two check words encoded in accordance with the Reed-Solomon code are used for error detection and correction purposes. However it is equally possible to use check words which are encoded by methods other than the Reed-Solomon code, with the method of the present invention, to obtain the advantages described hereinabove.

Figure 7:
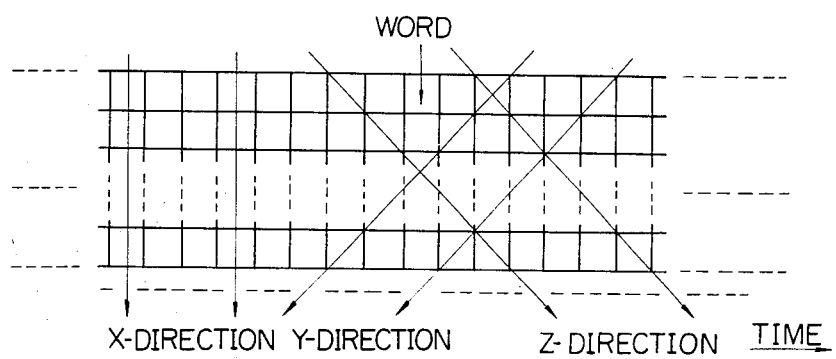
FIG. 7 is a diagram to illustrate an arrangement of sets of sub-blocks of a time-varying flow of data word, to which the method of the present invention is applicable.
Figure 8:
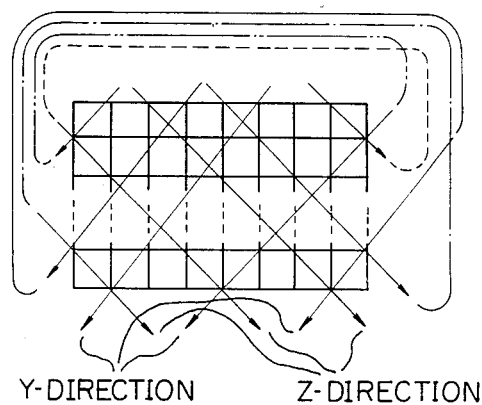
FIG. 8 shows an alternative arrangement of sets of sub-blocks of a time-varying flow of data words, to which the present invention is applicable.

The invention has been described in the above with respect to a code block which is of three-dimensional rectangular array configuration. However if each sub-block is provided with one error detection check word and two error correction check words, then the method of the present invention can be used to perform error detection and correction of any type of code block. The invention is applicable in this case, for example, to an infinitely long code block such as that shown in FIG. 7. In this case the three array direction along which the code block is divided into sub-blocks will mutually intersect as shown. It is also possible to periodically divide a code block of infinite length such as is shown in FIG. 7 into a succession of code blocks of finite length, in the manner illustrated in FIG. 8. Here, an intermediate position of a sub-block which occurs at one end of the code block is linked to the corresponding position at the opposite end of the code block, as shown.

FIG. 9 is a general block circuit diagram of an encoder circuit suitable for encoding the code block of FIG. 7. In FIG. 9, sets of data words are successively input in parallel to a Z-direction error correction encoder 30, to produce a sub-block which extends along the Z-direction. This Z-direction error correction encoder transfers each set of data words without change, while simultaneously generating a Z-direction error correction check word. The data words thus output are respectively transferred through a set of time delay circuits $D_{11}$ to $D_{1a}$, while the bits of the Z-direction error correction check word are transferred through a set of time delay circuits $D_{1(a+1)}$ to $D_{1b}$, with the time delay circuits $D_{11}$ to $D_{1b}$ having successively differing time delays. The outputs from these time delay circuits are input to a Y-direction error correction encoder 31 to produce a sub-block which extends along the Y-direction. Encoder 31 transfers each set of data words and the Z-direction error correction check word without change, while simultaneously generating a Y-direction error correction check word. The data words which are output from encoder 31 are respectively transferred through a set of time delay circuits $D_{21}$ to $D_{2a}$, while the bits of the Z-direction error correction check word are transferred through a set of time delay circuits $D_{2(a+1)}$ to $D_{2b}$, and the bits of the Y-direction error correction check word are transferred through a set of time delay circuits $D_{2(b+1)}$ to $D_{2c}$. The outputs from time delay circuits $D_{21}$ to $D_{2c}$ are input to a X-direction error correction encoder 32, which produces a sub-block extending along the X-direction. Encoder 32 transfers the data words without change, while simultaneously generating X-direction error detection check word. In this way, the data output from encoder 32 constitutes such a code block as shown in FIG. 7 and in which each sub-block contains one error-detection check word and two error-correction check-words.

Although the present invention has been described in the above with reference to specific embodiments, it should be noted that various changes and modifications to the embodiments may be envisaged, which fall within the scope claimed for the invention as set out in the appended claims. The above specification should therefore be interpreted in a descriptive and not in a limiting sense.

What is claimed is:

1. A code error correction method for correction of errors in a data block subsequent to reception of said data block after transmission thereof or reproduction of said data block after recording thereof, said data block comprising first, second and third sets of sub-blocks, each of said sub-block sets comprising the entirety of said data block divided into a plurality of sub-blocks along a common array direction, with the division directions of said first, second and third sets of sub-blocks being mutually different, each of said sub-blocks comprising at least first and second check-words and a plurality of data words, each of said data words and check-words being linked to a corresponding error flag constituted by a plurality of binary code bits, said error flag being settable to first, second and third logic states for respectively indicating a high, low and intermediate level of probability of error within the corresponding word, the method comprising the steps of:

(a) setting all of said error flags to said third logic state;

(b) performing an integral number of repetitions of a sequence of processing stages, said sequence comprising:

at least one error detection processing stage in which an error detection computation is performed for each sub-block of said first set thereof, utilizing the contents of all data words and check-words of said sub-block, and if any error is detected, setting all of the error flags of said sub-block which are in said third logic state to said first logic state while leaving the states of all other error flags of said sub-block unchanged, while if no error is detected then setting all of said error flags which are in said third logic state to said second logic state and leaving all other error flags of said sub-block unchanged, said processing sequence further comprising:

at least a first error correction processing stage applied to said second set of sub-blocks and a second error correction processing stage applied to said third set of sub-blocks, with at least one of said first and second error correction processing stages being immediately succeeded in said sequence or at the commencement of each repetition of said sequence by one of said error detection processing stages applied to said first set of sub-blocks.

2. An error correction method according to claim 1, in which each of said first and second error correction stages is immediately succeeded in said processing sequence or at the commencement of a repetition of said sequence by one of said error detection processing stages applied to said first set of sub-blocks, and in which the states of said error flags following each of said error correction stages are set to said first, second and third logic states respectively in accordance with whether the degree of probability of error remaining in the corresponding word after said correction processing is of high, low or intermediate probability.

3. An error correction method according to claim 2, in which each of said first and second error correction processing stages comprises the steps, applied to each of the sub-blocks in a set thereof, of:

(a) determining the number of error flags of the sub-block which are set to said first logic state;

(b) performing an error detection computation based upon the contents of the data words and check-words constituting the sub-block to thereby detect the presence of any errors in said data words and check-words;

(c) if no error is found in step (b) above, and the number of error flags found set to said first logic state in step (a) is less than 3, then resetting all of the error flags of said sub-block to said second logic state, while if no error is found in step (b) and the number of error flags found in said first logic state in step (a) is 3 or more, setting all of the error flags of said sub-block to said third logic state;

(d) if an error is found in step (b) above, while the number of error flags found set to said first logic state in step (a) above is zero, then performing computation based upon the contents of the data words and check-words of said sub-block to determine the position within said sub-block of a word in said sub-block containing an error, and if the position thus determined corresponds to the position of any word within said sub-block, then correcting the contents of said word utilizing the results of said computation and resetting all of the error flags of said sub-block to said second logic state, while if said position does not correspond to any word position in said sub-block then setting all of the error flags of said sub-block to said first logic state;

(e) if an error is found in step (b) above, while the number of said error flags found set to said first logic state in step (a) above is one, then performing computation based upon the contents of the data words and check-words of said sub-block to determine the position within said sub-block of a word containing an error, and if said position corresponds to the position of any word within said sub-block whose error flag is in said first logic state, then correcting the contents of said word utilizing the results of said computation and resetting all of the error flags of said sub-block to said second logic state, while if said position does not correspond to any word position in said sub-block then setting all of the error flags of said sub-block to said first logic state;

(f) if an error is found in step (b) above, while the number of said error flags found set to said first logic state in step (a) above is two, then performing an error correction computation based on the contents of the data words and check-words of said sub-block, and applying the results of said computation to correct the contents of each of the words corresponding to said two error flags, then setting all of the error flags of said sub-block to said third logic state;

(g) if an error is found in step (b) above, while the number of said error flags found set to said first logic state in step (a) above is greater than two, then performing computation based upon the contents of the data words and check-words of said sub-block to determine the position within said sub-block of a word containing an error, and if the position thus determined corresponds to the position of any word within said sub-block whose error flag is in said first logic state then correcting the contents of said word utilizing the results of said computation and setting all of the error flags of said sub-block to said third logic state, while if said position does not correspond to the position of any word within said sub-block whose error flag is in said first logic state, then performing no correction and setting all of the error flags of said sub-block to said third logic state.

4. An error correction method according to claim 1, in which said first correction processing stage is immediately succeeded by said second correction processing stage in said processing sequence or at the start of each repetition of said sequence, and in which said first error correction processing stage comprises the steps, applied to each of the sub-blocks of said second set thereof, of:

(a) determining the number of error flags of the sub-block which are set to said first logic state;

(b) performing an error detection computation based upon the contents of the data words and check-words constituting the sub-block to thereby detect the presence of any errors in said data words and check-words;

(c) if no error is found in step (b) above, and the number of error flags found set to said first logic state in step (a) is less than 3, then resetting all of said error flags to said second logic state, while if the number of error flags found in step (a) is 3 or more and no error is detected in step (b), leaving all of the error flags of said sub-block unchanged;

(d) if an error is found in step (b) above, while the number of error flags found set to said first logic state in step (a) above is zero, then performing computation based upon the contents of the data words and check-words of said sub-block to determine the position within said sub-block of any word in said sub-block containing an error, and if said position corresponds to the position of any word within said sub-block, then correcting the contents of said word utilizing the results of said computation and resetting all of the error flags of said sub-block to said second logic state, while if said position does not correspond to any word position in said sub-block then setting all of the error flags of said sub-block to said first logic state;

(e) if an error is found in step (b) above, while the number of said error flags found set to said first logic state in step (a) above is one, then performing computation based upon the contents of the data words and check-words of said sub-block to determine the position within said sub-block of a word containing an error, and if said position corresponds to the position of any word within said sub-block whose error flag is in said first logic state, then correcting the contents of said word utilizing the results of said computation and resetting all of the error flags of said sub-block to said second logic state, while if said position does not correspond to any word position in said sub-block then setting all of the error flags of said sub-block to said first logic state;

(f) if an error is found in step (b) above, while the number of said error flags found set to said first logic state in step (a) above is two, then performing an error correction computation based on the contents of the data words and check-words of said sub-block, and applying the results of said computation to correct the contents of each of the words corresponding to said two error flags, and leaving the states of all of the error flags of said sub-block unchanged;

(g) if an error is found in step (b) above, while the number of said error flags found set to said first logic state in step (a) above is greater than two, then performing computation based upon the contents of the data words and check-words of said sub-block to determine the position within said sub-block of a word containing an error, and if the position thus determined corresponds to the position of any word within said sub-block whose error flag is in said first logic state then correcting the contents of said word utilizing the results of said computation and leaving the states of all of the error flags of said sub-block unchanged, while if said position does not correspond to the position of any word within said sub-block whose error flag is in said first logic state, then performing no correction, while leaving the states of all of the error flags of said sub-block unchanged.

5. An error correction method according to claim 1, in which an initial error detection processing stage is performed on said first set of sub-blocks, prior to entering said repetitively implemented processing sequence.

6. An error correction method according to claim 1, in which a final error detection processing stage is performed on said first set of sub-blocks, upon exit from said repetitively implemented processing sequence.

* * * * *